(12) United States Patent
Lee et al.

(10) Patent No.: US 7,952,167 B2
(45) Date of Patent: May 31, 2011

(54) SCRIBE LINE LAYOUT DESIGN

(75) Inventors: Hsin-Hui Lee, Kaohsiung (TW);
Mirng-Ji Lii, Sinpu Township (TW);
Shin-Puu Jeng, Hsinchu (TW);
Shang-Yun Hou, Jubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 168 days.

(21) Appl. No.: 11/796,202

(22) Filed: Apr. 27, 2007

(65) Prior Publication Data
US 2008/0265378 A1    Oct. 30, 2008

(51) Int. Cl.
*H01L 29/06* (2006.01)

(52) U.S. Cl. ............... 257/618; 257/E21.523; 438/462

(58) Field of Classification Search .......... 257/618, 257/E21.523; 438/462
See application file for complete search history.

(56) References Cited

U.S. PATENT DOCUMENTS

| | | | |
|---|---|---|---|
| 5,047,711 A * | 9/1991 | Smith et al. ............ 324/760 |
| 5,096,855 A * | 3/1992 | Vokoun, III ............ 438/462 |
| 5,136,364 A | 8/1992 | Byrne | |
| 5,206,181 A * | 4/1993 | Gross ............ 438/18 |
| 5,239,191 A | 8/1993 | Sakumoto et al. | |
| 5,285,082 A | 2/1994 | Axer | |
| 5,371,411 A | 12/1994 | Hara et al. | |
| 5,751,065 A | 5/1998 | Chittipeddi et al. | |
| 5,831,330 A | 11/1998 | Chang | |
| 5,834,829 A | 11/1998 | Dinkel et al. | |
| 6,022,791 A | 2/2000 | Cook et al. | |
| 6,114,766 A | 9/2000 | Shields | |
| 6,121,677 A | 9/2000 | Song et al. | |
| 6,300,223 B1 | 10/2001 | Chang et al. | |
| 6,358,839 B1 | 3/2002 | Li et al. | |
| 6,365,958 B1 | 4/2002 | Ibnabdeljalil et al. | |
| 6,384,463 B1 | 5/2002 | Miles et al. | |
| 6,483,173 B2 | 11/2002 | Li et al. | |
| 6,492,716 B1 | 12/2002 | Bothra et al. | |
| 6,495,918 B1 | 12/2002 | Brintzinger | |
| 6,521,975 B1 | 2/2003 | West et al. | |
| 6,566,736 B1 | 5/2003 | Ogawa et al. | |

(Continued)

FOREIGN PATENT DOCUMENTS

CN        1542505 A        11/2004

(Continued)

OTHER PUBLICATIONS

Pidin, S., et al., "MOSFET Current Drive Optimization Using Silicon Nitride Capping Layer for 65-nm Technology Node," 2004 Symposium on VLSI Technology Digest of Technical Papers, IEEE, pp. 54-55.

(Continued)

*Primary Examiner* — Thao X Le
*Assistant Examiner* — Matthew Gordon
(74) *Attorney, Agent, or Firm* — Slater & Matsil, L.L.P.

(57) ABSTRACT

A scribe line layout design to reduce the damage caused by sawing the wafer is presented. An embodiment comprises metal plates located within the scribe lines and at least partially within the junctions of the scribe lines. Each of these metal plates has one or more slots to help relieve the pressure. Alternatively, instead of metal plates, grooves that may be filled with metal could be placed into the scribe lines. These metal plates could also be used concurrently with a seal ring for better protection during sawing.

20 Claims, 5 Drawing Sheets

U.S. PATENT DOCUMENTS

| | | |
|---|---|---|
| 6,605,861 B2 | 8/2003 | Toyoda |
| 6,796,024 B2 | 9/2004 | Katoh et al. |
| 6,806,168 B2 | 10/2004 | Towle et al. |
| 6,841,455 B2 | 1/2005 | West et al. |
| 6,861,754 B2 | 3/2005 | Lin et al. |
| 6,861,755 B2 | 3/2005 | Hosoda et al. |
| 6,876,062 B2 | 4/2005 | Lee et al. |
| 6,876,064 B2 | 4/2005 | Matumoto et al. |
| 6,876,946 B2 | 4/2005 | Yasuda et al. |
| 6,939,736 B2 | 9/2005 | Grabham et al. |
| 6,963,389 B2 | 11/2005 | Fukada |
| 6,998,712 B2 | 2/2006 | Okada et al. |
| 7,087,452 B2 | 8/2006 | Joshi et al. |
| 7,126,225 B2 | 10/2006 | Su et al. |
| 7,126,255 B2 | 10/2006 | Yamaguchi et al. |
| 7,129,565 B2 | 10/2006 | Watanabe et al. |
| 7,129,566 B2 | 10/2006 | Uehling et al. |
| 7,135,384 B2 | 11/2006 | Takyu et al. |
| 7,138,297 B2 | 11/2006 | Iijima et al. |
| 7,145,211 B2 | 12/2006 | Mallikarjunaswamy et al. |
| 7,235,834 B2 | 6/2007 | Fukada |
| 7,235,864 B2 | 6/2007 | Lee |
| 7,259,445 B2 | 8/2007 | Lau et al. |
| 7,291,874 B2 | 11/2007 | Hsu |
| 7,294,937 B2 | 11/2007 | Su et al. |
| 7,335,577 B2 | 2/2008 | Daubenspeck et al. |
| 7,387,950 B1 * | 6/2008 | Kuo et al. ............ 438/462 |
| 7,407,835 B2 | 8/2008 | Chuang |
| 7,456,507 B2 | 11/2008 | Yang |
| 7,646,078 B2 | 1/2010 | Jeng et al. |
| 2001/0005617 A1 | 6/2001 | Feurle et al. |
| 2001/0008296 A1 | 7/2001 | Gelsomini et al. |
| 2002/0024115 A1 | 2/2002 | Ibnabdeljalil et al. |
| 2004/0084777 A1 | 5/2004 | Yamanoue et al. |
| 2004/0119164 A1 | 6/2004 | Kurashima et al. |
| 2004/0150070 A1 | 8/2004 | Okada et al. |
| 2005/0009300 A1 | 1/2005 | Murari et al. |
| 2005/0026397 A1 | 2/2005 | Daubenspeck et al. |
| 2005/0098893 A1 | 5/2005 | Tsutsue et al. |
| 2005/0148115 A1 | 7/2005 | Williams et al. |
| 2005/0230005 A1 * | 10/2005 | Liang et al. ............ 148/33.3 |
| 2005/0269702 A1 | 12/2005 | Otsuka |
| 2005/0280120 A1 | 12/2005 | Tomita |
| 2006/0012012 A1 | 1/2006 | Wang et al. |
| 2006/0022195 A1 | 2/2006 | Wang |
| 2006/0055002 A1 | 3/2006 | Yao et al. |
| 2006/0055007 A1 | 3/2006 | Yao et al. |
| 2006/0125090 A1 | 6/2006 | Chen et al. |
| 2006/0172457 A1 | 8/2006 | Huang |
| 2006/0192265 A1 | 8/2006 | Hsu |
| 2007/0090447 A1 | 4/2007 | Morimoto et al. |
| 2007/0090547 A1 | 4/2007 | Su et al. |
| 2007/0158788 A1 | 7/2007 | Yang |
| 2008/0265378 A1 | 10/2008 | Lee et al. |
| 2008/0283969 A1 | 11/2008 | Jeng et al. |
| 2009/0115024 A1 | 5/2009 | Jeng et al. |
| 2009/0321890 A1 | 12/2009 | Jeng et al. |
| 2010/0123219 A1 | 5/2010 | Chen et al. |
| 2010/0207251 A1 | 8/2010 | Yu et al. |

FOREIGN PATENT DOCUMENTS

| | | |
|---|---|---|
| CN | 1701418 A | 11/2005 |
| CN | 1770432 A | 5/2006 |
| CN | 1830079 A | 9/2006 |
| CN | 1956173 A | 5/2007 |

OTHER PUBLICATIONS

"Motorola MC7457RX1000NB Microprocessor," Sample Prep Delamination, Motorola Chipworks, Mar. 15, 2005, 1 page, Figure 3.1.3 Die Seal.

* cited by examiner

SCRIBE LINE LAYOUT DESIGN

TECHNICAL FIELD

The present invention relates generally to a system and method for manufacturing semiconductor devices and, more particularly, to improving the quality of dicing when dicing semiconductor dies.

BACKGROUND

In the manufacturing of semiconductor devices, the first step is the formation of a silicon wafer. These wafers are manufactured by growing a single silicon crystal. This single crystal is then processed through such steps as the evaluation and testing of the physical properties of the crystal, grinding the crystal to a desired diameter, sawing the single silicon crystal into wafers, marking the wafers with a laser, grinding the wafers to a specified thickness, edge rounding, etching away damaged areas, and polishing the surface.

These wafers are then processed into individual dies by the deposition and placement of structures and layers onto the wafers. Once each of the dies has been tested for functionality, the dies are separated from the wafer using a saw. Generally, sufficient space is left between adjacent dies to allow for the width of a saw blade during cutting. This space between the dies is referred to as a scribe line, and may contain test structures used to verify the properties of the die.

Unfortunately, the physical process of sawing the wafer may damage the physical structure of the dies, especially around the corners of the die. For example, the saw could crack the silicon crystal, and these cracks could then propagate through the dies. The saw may also cause a partial or complete delamination of the dies, essentially pulling off some of the layers that have been deposited onto the wafer. Damage such as this would render the dies unusable and decreases the yield.

Further, as the transition is made to low-K dielectrics, extremely low-K dielectrics, and ultra-low K dielectrics, the size of die will continue to shrink. This reduction in size is expected to exasperate the problem with damage created by separating the die, and makes this problem even more critical.

SUMMARY OF THE INVENTION

These and other problems are generally solved or circumvented, and technical advantages are generally achieved, by preferred embodiments of the present invention which help to prevent cracking and delamination of semiconductor dies when the dies are cut from the wafer.

In accordance with an embodiment of the present invention, there is a semiconductor wafer having dies formed thereon, and scribe lines running substantially parallel to the edges of the die. One or more metal plates are located on the scribe lines, such that at least a portion of the metal plate is located within a junction of the scribe lines. Each metal plate has one or more slots formed within it.

Another aspect of the present invention involves a plurality of semiconductor dies formed on a semiconductor wafer. Scribe lines are located between each of the dies, run parallel to the edges of the die, and form junctions wherever two scribe lines intersect. Grooves which may or may not be filled with metal are located within the scribe lines and run parallel to the longitudinal axis of the scribe lines.

Yet another aspect of the present invention involves a semiconductor wafer, dies located on the semiconductor wafer, scribe lines located between the dies, and a seal ring running along at least part of the outside edge of the die. One or more metal plates, with slots located therein, are located in the scribe lines outside of the seal ring, such that at least a portion of the metal plate is located within a junction of the scribe lines. Apertures are located within the seal ring and adjacent to the corner of the die.

The metal plates and grooves located within the scribe lines work to release pressure caused by the sawing of the wafer during the dicing process. By relieving this pressure, the damage done during the dicing process can be reduced, and fewer die will be rendered useless.

BRIEF DESCRIPTION OF THE DRAWINGS

For a more complete understanding of the present invention, and the advantages thereof, reference is now made to the following descriptions taken in conjunction with the accompanying drawing, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a scribe line layout design to prevent damage during dicing operations. The invention may also be applied, however, to other dicing operations where cracking and defects are a problem.

Figure 1:
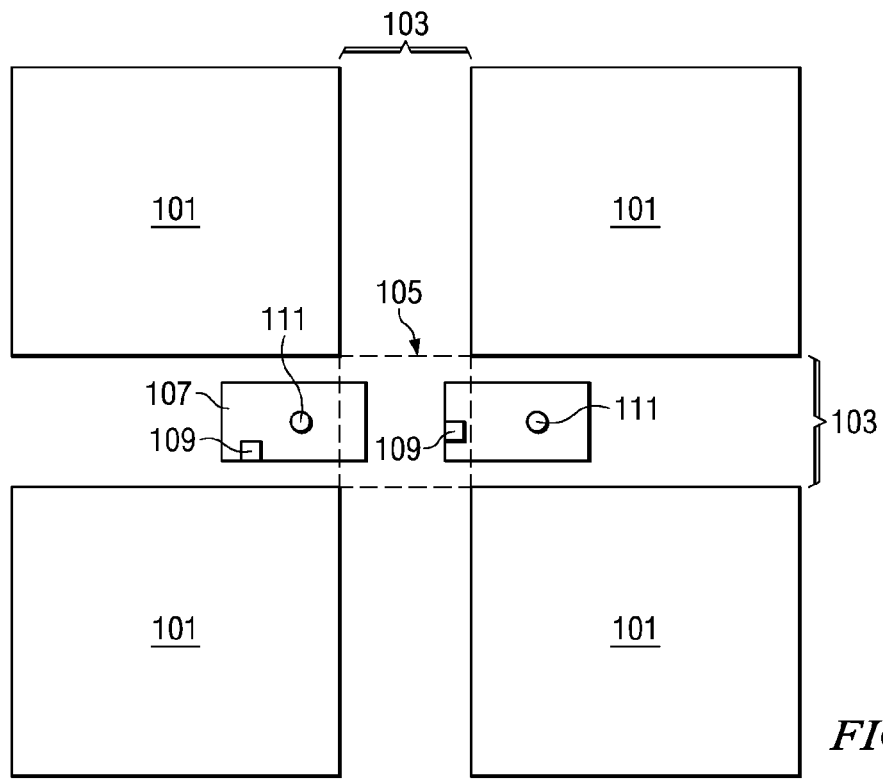
FIGS. 1-4 illustrate various embodiments in which a metal plate is positioned within a scribe line between semiconductor dies on a semiconductor wafer, in accordance with embodiments of the present invention.

With reference now to FIG. 1, there is shown an embodiment of the present invention comprising a plurality of individual dies 101, wherein each die 101 includes a substrate (not shown) having electronic devices formed thereon as is known in the art. The substrate is typically covered with one or more dielectric layers and one or more conductive layers between adjacent dielectric layers. The conductive layers provide connectivity and routing for the underlying electronic devices. There could be any number of alternating layers of conductive and dielectric layers located on the die, but a typical range of layers would be from three layers to twelve layers of alternating conductive and dielectric layers.

Separating the individual dies 101 are scribe lines 103, which form an area for a saw to be used to separate the die 101 from the wafer. In an embodiment, scribe lines 103 run substantially parallel to the edges of the individual dies 101. Accordingly, the scribe lines 103 intersect each other at the corners of the dies 101 to form a junction 105 (denoted on FIG. 1 by a dotted line).

The scribe lines 103 are formed by not placing functional structures (structures that will be used by the die 101 once it has been cut from the wafer) into the area intended for the scribe line 103. Other structures, such as test pads or dummy metals used for planarization, could be placed into the scribe line 103, but would not be necessary for the functioning of the die 101 once the die 101 has been cut from the wafer. The scribe lines 103 preferably have a width of between about 20 μm and about 180 μm, with a preferred width of about 80 μm.

In an embodiment of the present invention, one or more metal plates 107 are formed within the scribe line 103 such that at least a portion of at least one metal plate 107 is located within the junction 105 of the scribe lines 103. The metal plates 107 may be placed into any of the layers formed on the wafer, and are preferably placed on the top layer. The metal plates 107 preferably extend along the longitudinal axis of the scribe line 103 from the junction 105 to a distance of between about 0.1 μm and about 600 μm, and a preferred distance of about one-half of the width of the scribe line in which the metal plate 107 is located. The metal plates 107 preferably have a width perpendicular to the longitudinal axis of the scribe line 103 that is between about 20 μm and about 180 μm, with a preferred width of about 80 μm. The thickness of the metal plate 107 is preferably between about 1 Å to about 100,000 Å, with a preferred thickness of 1.2 μm.

These metal plates 107 preferably comprise a metal, such as aluminum, copper, and the like, a metal alloy, such as an aluminum-copper alloy and the like, and the like. The metal plates 107 may be formed through any suitable process. For example, in an embodiment in which the metal plates 107 comprise aluminum, the metal plates 107 are preferably formed by forming a layer of aluminum and then selectively removing the undesired portions to form the metal plates 107. Alternatively, in an embodiment in which the metal plates 107 comprise copper, a damascene process is preferably used in order to form the metal plates 107. However, the examples listed above are merely illustrative of suitable processes that may be used to form the metal plates 107, and are not intended to limit the present invention. Any other suitable process that may be used to form the metal plates 107 is intended to be included within the scope of the present invention.

In an embodiment of the present invention, one or more slots 111 filled with dielectric material are located within the metal plates 107. While represented by a circle in FIG. 1, the slots 111 could be any desired shape, such as a rectangle, a line, a square, a triangle, an ellipse, or the like. Additionally, the slots 111 could be in the shape of a notch 109. If the slots 111 are in the shape of a notch 109, the notches 109 would preferably be located along the outside perimeter of the metal plate 107. Preferably, the area of any single slot 111 makes up no more than 10% of the overall area of the metal plate 107 in which the slot 111 is located.

The formation of the slots 111 are dependent upon the material used for the metal plates 107. For example, in an embodiment in which the metal plates 107 are copper, the pattern for the slots 111 is simply not etched when the damascene process is begun, forming a slot filled with dielectric material. However, any suitable process to form these slots 111, depending upon the material used to form the metal plates 107, could be used, and the process described above are not meant to limit the present invention.

Figure 2:
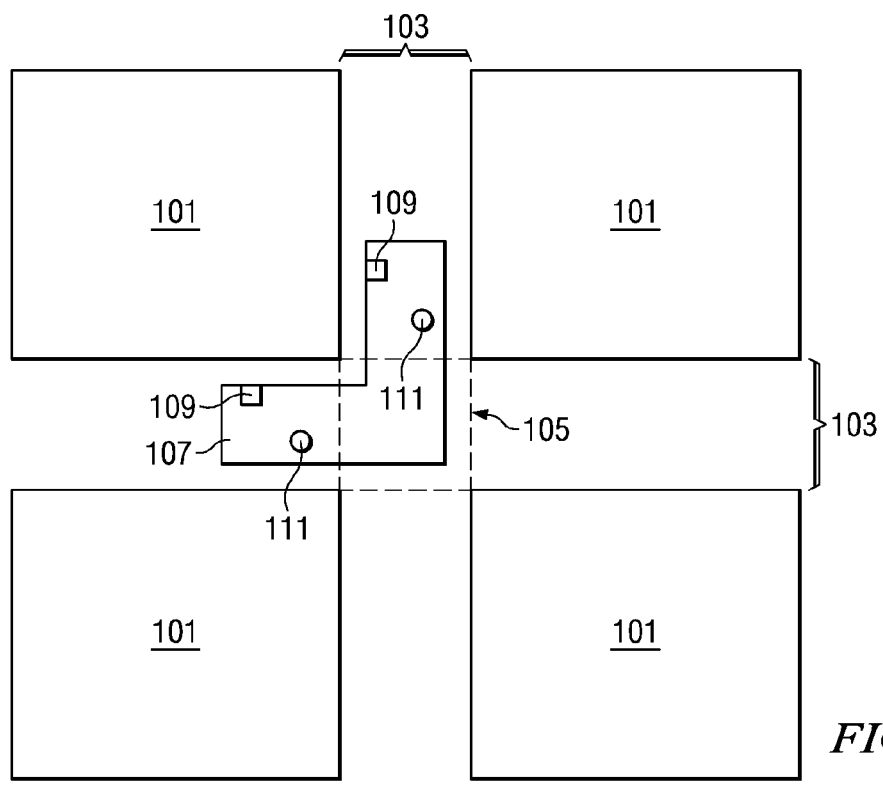

FIG. 2 illustrates another embodiment of the present invention wherein the metal plates 107 are formed within two scribe lines 103 and form an "L" shape. In this embodiment the "L" shape is formed so that one dimension is located on one scribe line 103 and the other dimension is located on a substantially perpendicular scribe line 103. The metal plates 107 and slots 111 of this embodiment are preferably formed in a similar fashion as described above with reference to FIG. 1.

However, when the metal plates 107 extend between two different scribe lines 103 and through the junction 105 of the scribe lines, the slots 111 are preferably sized and located in a specific way in relation to the metal plates 107. In an embodiment, the metal plates 107 can be divided into separate specific regions: regions located between any two adjacent dies 101 (there could be multiple regions on a single metal plate 107 defined by this), and a separate region located within the junction 105 of the scribe lines 103. While there does not need to be a slot 111 located within each region, within any single region where a slot 111 is located, the total area of all of the slots 111 located within that region should make up no more than 20% of the surface area of that region. Additionally, if there are slots 111 located in more than one of the regions, the total area of all of the slots 111 located in all of the regions of a single metal plate 107 should not be greater than 20% of the total surface area of the metal plate 107.

Figure 3:
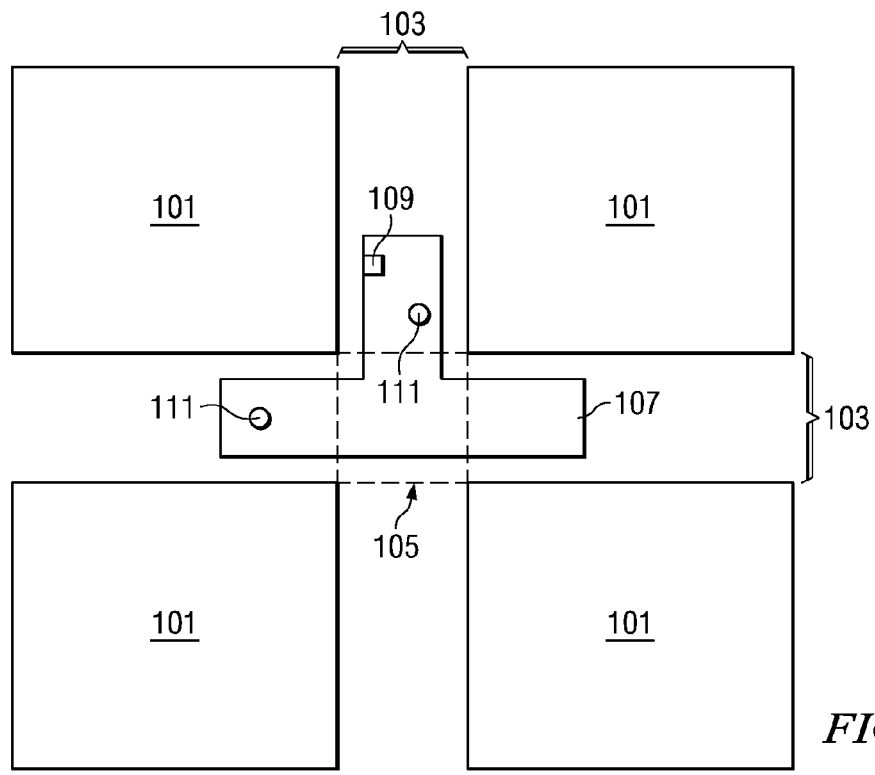

FIG. 3 illustrates another embodiment of the present invention wherein the metal plates 107 are formed to make a "T" shape between two scribe lines 103. In this embodiment, one dimension of the metal plate 107 extends from a point between two dies 101, through the junction 105 and ends at a point between two different dies 101. Additionally, the metal plate 107 branches at the junction to extend into another scribe line 103 that is substantially perpendicular to the original scribe line 103. In an embodiment, the metal plate 107 may also contain slots 111 as described above with reference to FIG. 1. However, similar to the embodiment described above with reference to FIG. 2, the slots 111 preferably make up no more than 20% of any single region of the metal plate 107 in which they are located, and the total area of all of the slots 111 on the metal plate 107 preferably make up no more than 20% of the total area of the entire metal plate 107. The metal plates 107 and the slots 111 are formed in a similar fashion as described above with reference to FIG. 1.

Figure 4:
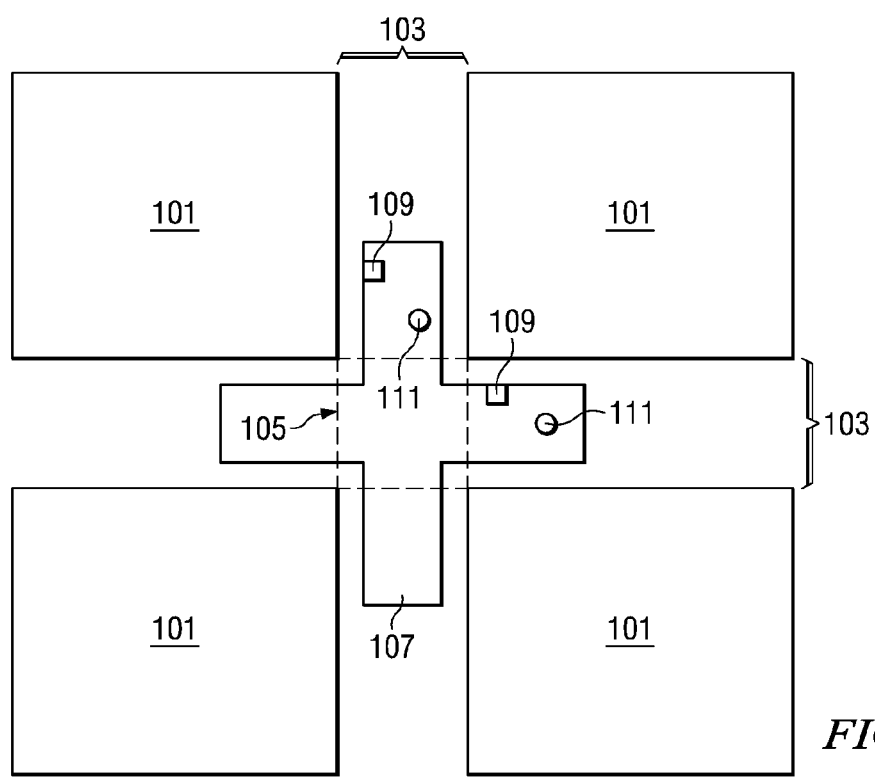

FIG. 4 illustrates yet another embodiment of the present invention wherein the metal plates 107 are formed to make an arithmetic "plus" shape within the scribe lines 103. In this embodiment the metal plates 107 extend outward from the junction 105 along each scribe line 103, such that two lines that are substantially perpendicular to each other are formed within the scribe lines 103. In this embodiment, the lengths that the metal plates 107 extend into the scribe lines 103 may be, but do not have to be, equal to each other.

The metal plates 107 of this embodiment may also contain slots 111 as described above with reference to FIG. 1. However, similar to the embodiment described with reference to FIG. 2, in this embodiment the slots 111 preferably make up no more than 20% of any single region of the metal plate 107 in which the slots 111 are located, and the total area of all of the slots 111 preferably make up no more than 20% of the total area of the metal plate 105. The metal plates 107 and the slots 111 are preferably formed in a similar fashion as described above with reference to FIG. 1.

Figure 4A:
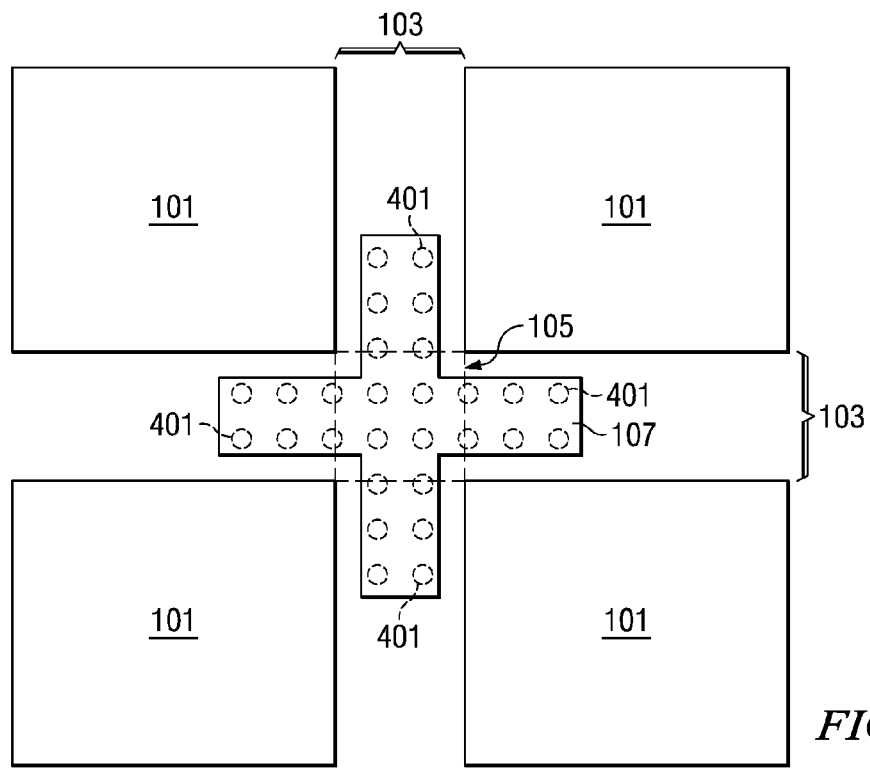
FIG. 4A illustrates a cut-away view of a metal plate position within a scribe line and connected to conductive vias, in accordance with an embodiment of the present invention.

FIG. 4a illustrates, in a cut away view, that, optionally, the metal plates 107 could be electrically coupled to conductive vias 401, thereby providing electrical connections to elements in other layers of the die 101. The metal plates 107 could then be used as a test pad for testing the die 101 prior to separating the die 101 from the wafer.

Figure 5:
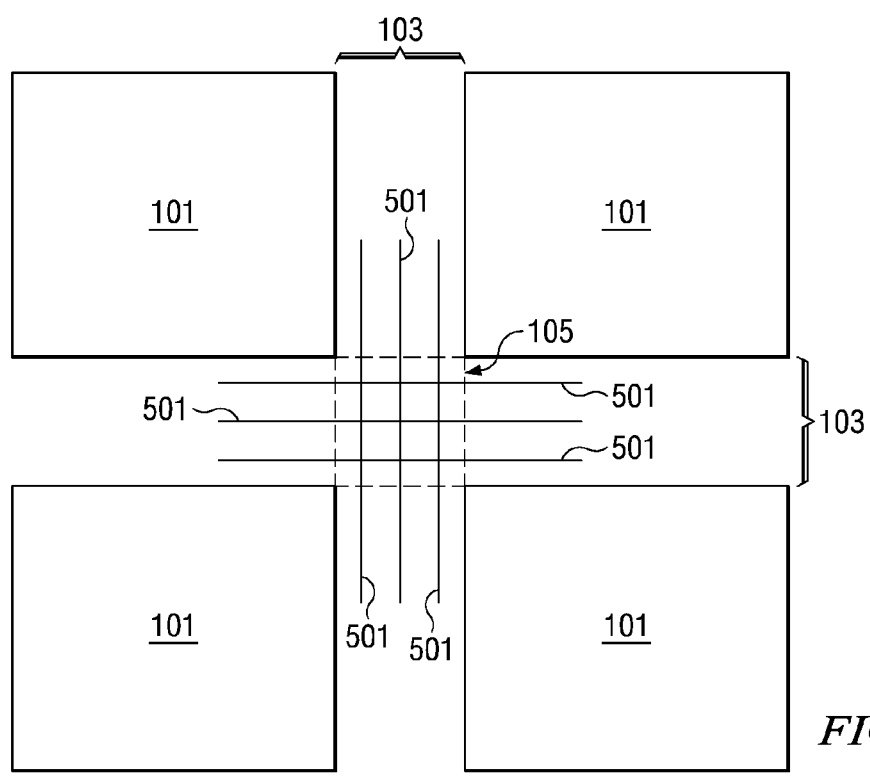
FIGS. 5-6 illustrate grooves located within a scribe line between semiconductor dies on a semiconductor wafer, in accordance with an embodiment of the present invention.

FIG. 5 illustrates an alternative embodiment of the present invention, wherein grooves 501, instead of metal plates 107 (FIGS. 1-4), are formed within the scribe lines 103. In this embodiment grooves 501 are formed to run substantially parallel to a longitudinal axis of the scribe line 103 in which they are located, and are formed such that the grooves 501 are not substantially adjacent to the die 101 itself. While only three grooves 501 per scribe line 103 are shown in FIG. 5, it should be understood that any desired number of grooves 501 could be formed within the scribe lines 103.

These grooves 501 are preferably formed concurrently with each layer of the die, and the grooves 501 in each layer may be connected to the grooves 501 in the adjacent layers of the die 101. This has the effect of stacking the grooves 501 from the major surface of the scribe line 103 to the substrate of the die. However, the grooves 501 could alternatively be stacked to extend to any desired layer of the die 101. These grooves 501 preferably have a width perpendicular to the longitudinal axis of the grooves 501 of between about 1 µm and about 178 µm, with a preferred width of approximately 2 µm less than the scribe line 103 in which the groove 501 is located.

Preferably, the grooves 501 are filled with a metal, such as aluminum, copper, and the like, a metal alloy, such as an aluminum-copper alloy and the like, and the like. However, the grooves 501 could alternatively remain empty. If the grooves 501 are filled with a metal, the grooves 501 could be filled through a damascene process whereby a hole is etched in the layer and then filled with a metal.

Figure 6:
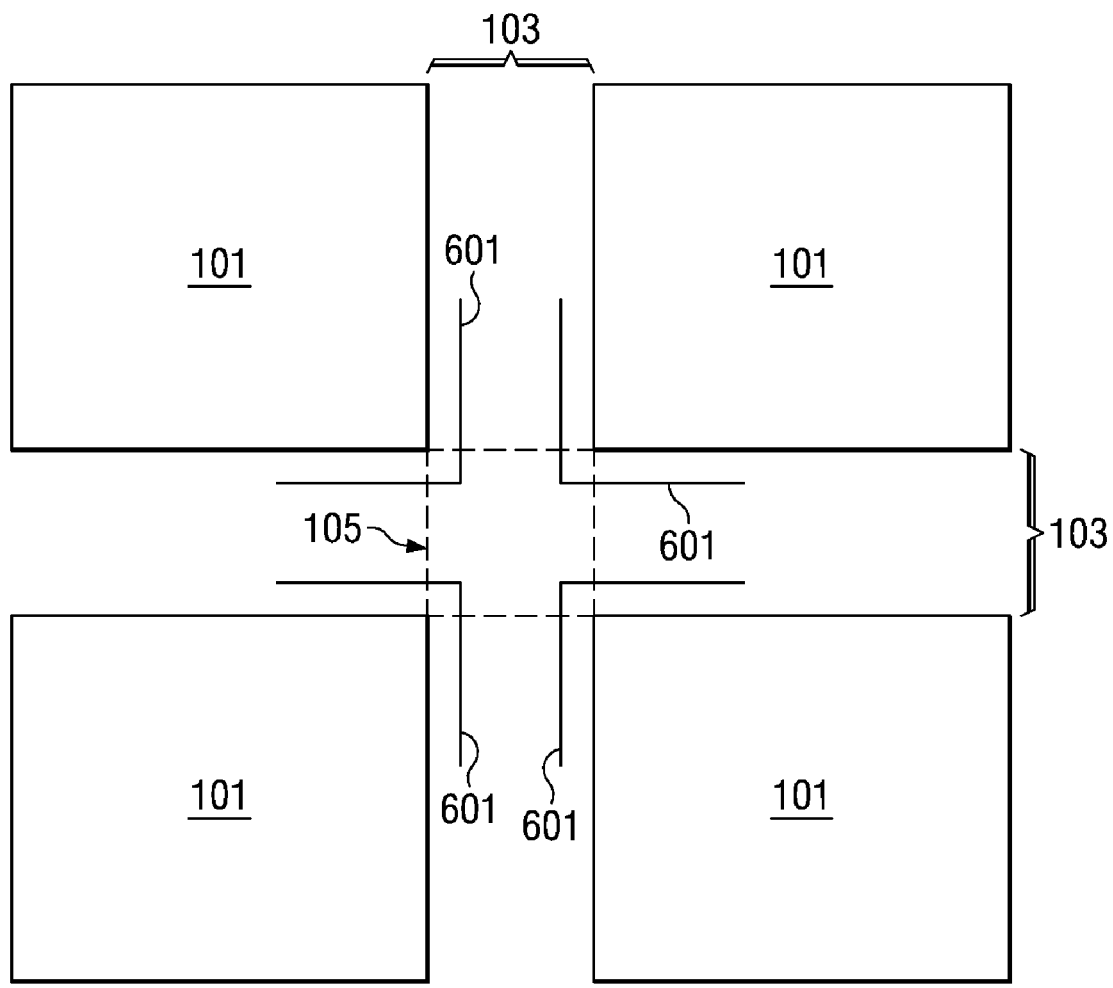

FIG. 6 illustrates another embodiment of the present invention, wherein grooves 601 are formed within the scribe lines 103 and form the shape of an "L" at the corner of the dies 101. These grooves 601 are formed such that one dimension of the grooves 601 are formed in one scribe line 103, and the other dimension of the grooves 601 extends around the corner of the die 101 and down a substantially perpendicular scribe line 103. The grooves 601 of this embodiment are formed in a similar fashion and with similar materials as described above with reference to FIG. 5, and also may or may not be filled with a metal.

Furthermore, each embodiment of the present invention as described above with reference to FIGS. 1-6 is not intended to be the only embodiment used on a single wafer. Any combination of the above embodiments could be used at separate junctions 105 of the scribe lines 103 in different areas of an individual wafer, depending on the structures placed on the wafer.

The placement of these metal plates 107 with slots 111 located within them, or the placement of these grooves 501 into the scribe lines 103 help to reduce the damage done while sawing the wafer. Specifically, the metal plates 107 and grooves 501 work to release the stresses caused by the dicing process, so that these stresses do not cause damage to the surrounding die 101.

Figure 7A:
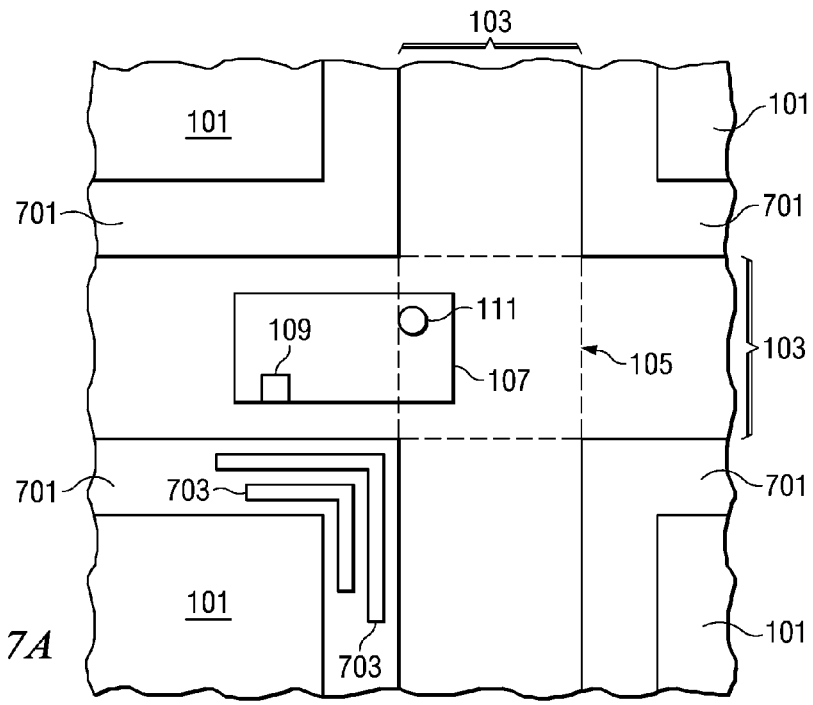
FIG. 7A illustrates a metal plate containing slots located within a scribe line between semiconductor dies on a semiconductor wafer and outside of a seal ring that has trenches adjacent to the corner of the die, in accordance with an embodiment of the present invention.

FIG. 7A illustrates as close up view of the corner region of a die 101 in an embodiment of the present invention in which the metal plates 107 as described above with respect to FIGS. 1-6 are used concurrently with a seal ring 701. The seal ring 701 may be used to help protect the functional components of the die 101. Additionally, if desired, the seal ring 701 could be electrically connected to the functional circuit elements within the die 101 in order to provide an electrical connection to those elements.

The seal ring 701 is formed on the top layer of the die and is located around the functional aspects of the die 101. The seal ring 701 separates any functional components located on the die 101 from the scribe lines 103. However, other elements, such as bond pads, could be located outside of the seal ring 701 on the die 101.

The seal ring 701 preferably comprises a conductive material such as copper, aluminum, tungsten, alloys of these, and the like. However, other materials, such as layers of conductive and insulative materials, could alternatively be used. The seal ring 701 is preferably formed to have a width of between about 5 µm and about 300 µm, with a preferred width of about 10 µm.

An array of apertures is located within a portion of the seal ring 701 adjacent to a corner of the die 101. The array of apertures may be one or more trenches 703 formed within the seal ring 701 that follow the shape of the corner of the die 101 (forming an "L" shape). At least one portion of each trench 703 extends parallel to each edge of the die 101. The one or more trenches 703 are preferably formed with a width of between about 1 µm and about 50 µm, with a preferred width of 10 µm, and are also preferably formed with a length of about 1 µm and about 100 µm, with a preferred length of about 20 µm.

Figure 7B:
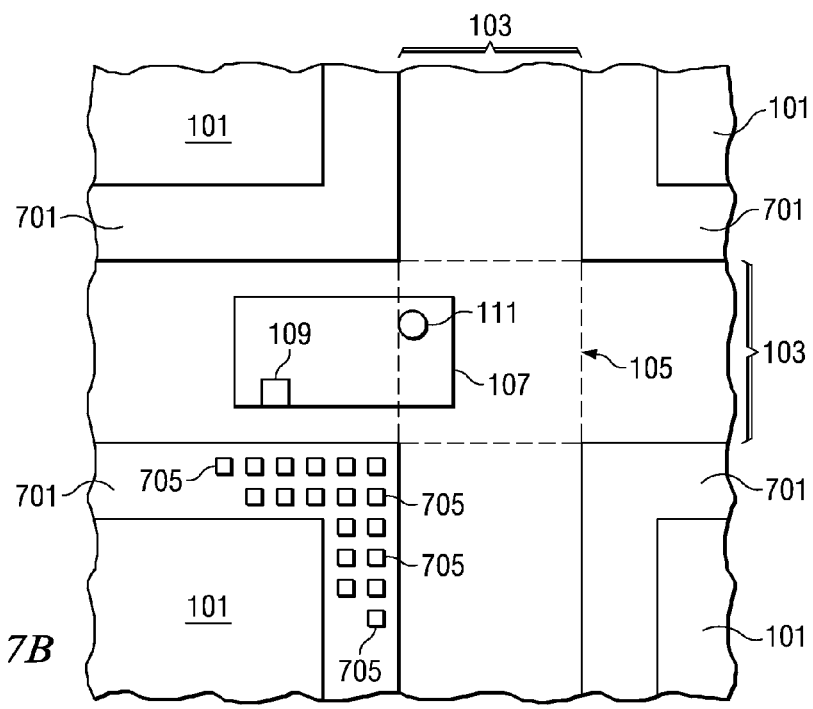
FIG. 7B illustrates a metal plate containing slots located within a scribe line between semiconductor dies on a semiconductor wafer and outside of a seal ring that has two rows of holes near the corner of the die, in accordance with an embodiment of the present invention.

FIG. 7B shows a close up view of a corner of a die 101 in an alternative embodiment of the array of apertures located within the seal ring 701. In this embodiment, the array of apertures could comprise two or more rows of holes 705 in the area of the seal ring 701 adjacent to the corner of the die 101. The two or more rows of holes 705 may extend parallel to one of the edges of the die, or could form an "L" shape similar to the trenches 703 described above with reference to FIG. 7A. The two or more rows of holes 705 have a preferred length along an edge of the die 101 of between about 1 µm and about 80 µm, with a preferred length of about 10 µm.

Although the present invention and its advantages have been described in detail, it should be understood that various changes, substitutions and alterations can be made herein without departing from the spirit and scope of the invention as defined by the appended claims. For example, there are multiple patterns and shapes that could be used for the slots. Any of these patterns or shapes that achieve substantially the same result as the corresponding embodiments described herein may be utilized according to the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:
1. A semiconductor device comprising:
a semiconductor wafer comprising a plurality of semiconductor dies formed thereon;

scribe lines located between adjacent semiconductor dies, such that the intersecting scribe lines form junctions at corners of the semiconductor dies;

one or more metal plates located within one or more of the scribe lines, such that the one or more metal plates are located along a top-most surface of the one or more scribe lines and at least a portion of the one or more metal plates is located within one of the junctions; and one or more slots located within the one or more metal plates, the one or more slots being filled with a solid dielectric material.

2. The semiconductor device of claim 1, wherein each of the one or more slots comprises no more than about 10% of the overall area of the one or more metal plates.

3. The semiconductor device of claim 1, wherein at least one of the one or more slots is in the shape of a notch on an edge of at least one of the one or more metal plates.

4. The semiconductor device of claim 1, wherein the one or more metal plates are in the shape of an "L," a "T," or an arithmetic "plus" symbol.

5. The semiconductor device of claim 1, wherein each of the one or more metal plates are divided into two or more regions, a first region being located within the junction and additional regions being separately located within the scribe lines and between two semiconductor dies, and wherein the total of the one or more slots located within one of the two or more regions comprises no more than 20% of the overall area of the region in which the one or more slots are located.

6. The semiconductor device of claim 1, wherein the total area of the one or more slots is no greater than about 20% of the total area of the one or more metal plates in which the one or more slots are located.

7. The semiconductor device of claim 1, further comprising:

a conductive ring located along at least a portion of the outside edge of one or more of the plurality of semiconductor dies; and apertures located within the conductive ring, the apertures located substantially adjacent to the junctions.

8. The semiconductor device of claim 1, further comprising:

a seal ring located along at least a portion of the outside edge of one or more of the plurality of semiconductor dies; and apertures located within the seal ring, the apertures located substantially adjacent to corners of the one or more of the plurality of semiconductor dies.

9. The semiconductor device of claim 8, wherein each of the slots comprises no more than about 10% of the overall area of one of the one or more metal plates.

10. The semiconductor device of claim 8, wherein the apertures comprise trenches within the seal ring.

11. The semiconductor device of claim 8, wherein the apertures comprise two rows of holes.

12. The semiconductor device of claim 8, wherein the one or more metal plates are in the shape of an "L," a "T," or an arithmetic "plus" symbol.

13. The semiconductor device of claim 12, wherein each of the one or more metal plates may be divided into two or more regions, a first region being located within the junction and additional regions being separately located within the scribe line and between two of the plurality of semiconductor dies, and wherein the slots located within one of the two or more regions comprises no more than 20% of the overall area of the one of the two or more regions in which the slots are located.

14. The semiconductor device of claim 8, wherein the total area of the slots located within each of the one or more metal plates is no greater than about 20% of the total area of each of the one or more metal plates.

15. The semiconductor device of claim 8 wherein the seal ring comprises a conductive material and is electrically connected to one of the plurality of semiconductor dies.

16. A semiconductor device comprising:

a semiconductor wafer;

a first plurality of scribe lines extending in a first direction;

a second plurality of scribe lines extending in a second direction and intersecting the first plurality of scribe lines such that one or more junctions are formed;

one or more metal plates located at least partially in one of the one or more junctions and extending along one of the first plurality of scribe lines away from the one of the one or more junctions, at least one of the one or more metal plates being located in a top-most layer of the one of the one or more junctions; and one or more slots located within the at least one of the one or more metal plates, the one or more slots comprising a firm dielectric material.

17. The semiconductor device of claim 16, wherein each of the slots comprises no more than about 10% of the overall area of one of the one or more metal plates.

18. The semiconductor device of claim 16, wherein each of the one or more metal plates comprises a first region located within the one of the one or more junctions and a second region located outside of the one of the one or more junctions, wherein one of the one or more slots located with the first region comprises no more than 20% of the overall area of the first region.

19. The semiconductor device of claim 16, wherein the total area of all of the one or more slots on a single one of the one or more metal plates is no greater than about 20% of the total area of the single one of the one or more metal plates.

20. The semiconductor device of claim 16, wherein at least one of the one or more slots is in the shape of a notch located at an outside perimeter of the one or more metal plate in which the slot is located.

* * * * *